United States Patent
Yang et al.

(10) Patent No.: US 8,970,280 B2
(45) Date of Patent: Mar. 3, 2015

(54) INPUT CLAMPING STRUCTURE FOR SOUND QUALITY IMPROVEMENT IN CAR-RADIO CLASS-AB POWER AMPLIFIER DESIGN

(71) Applicant: STMicroelectronics (Shenzhen) R&D Co. Ltd., Shenzhen (CN)

(72) Inventors: Mei Yang, Shenzhen (CN); YueHua Wang, Shenzhen (CN); Xaut Zhang, Shenzhen (CN); Kelvin Wen, Shenzhen (CN); XiangSheng Li, Shenzhen (CN)

(73) Assignee: STMicroelectronics (Shenzhen) R&D Co. Ltd., Shenzhen (CN)

( * ) Notice: Subject to any disclaimer, the term of this patent is extended or adjusted under 35 U.S.C. 154(b) by 68 days.

(21) Appl. No.: 13/707,350

(22) Filed: Dec. 6, 2012

(65) Prior Publication Data

US 2013/0169362 A1 Jul. 4, 2013

(30) Foreign Application Priority Data

Dec. 30, 2011 (CN) .......................... 2011 1 0461474

(51) Int. Cl.
*H03K 5/08* (2006.01)
*H03F 3/26* (2006.01)
*H03F 3/187* (2006.01)
*H03F 3/45* (2006.01)
*H03F 3/68* (2006.01)

(52) U.S. Cl.
CPC .................. *H03F 3/26* (2013.01); *H03F 3/187* (2013.01); *H03F 3/45475* (2013.01); *H03F 3/68* (2013.01); *H03F 2203/45102* (2013.01); *H03F 2203/45244* (2013.01); *H03F 2203/45528* (2013.01); *H03F 2203/45552* (2013.01)
USPC ............ 327/309; 327/321; 327/327; 327/483

(58) Field of Classification Search
USPC ......... 327/309, 310, 313, 314, 318, 321, 324, 327/327, 483, 575
See application file for complete search history.

(56) References Cited

U.S. PATENT DOCUMENTS 6,549,061 B2 * 4/2003 Voldman et al. ............... 327/483

* cited by examiner

*Primary Examiner* — Long Nguyen
(74) *Attorney, Agent, or Firm* — Allen, Dyer, Doppelt, Milbrath & Gilchrist, P.A. Attorneys at Law

(57) ABSTRACT

A clamping circuit for a class AB amplifier includes a reference voltage circuit, four NPN Darlington transistors having inputs coupled to the reference voltage circuit, and outputs for providing four clamped voltages, and a split NPN Darlington transistor having an input coupled to the reference voltage circuit, and four separate outputs for providing four AC ground voltages.

20 Claims, 7 Drawing Sheets

INPUT CLAMPING STRUCTURE FOR SOUND QUALITY IMPROVEMENT IN CAR-RADIO CLASS-AB POWER AMPLIFIER DESIGN

RELATED APPLICATION

This application is a translation of and claims the priority benefit of Chinese patent application number 201110461474.2, filed on Dec. 30, 2011, entitled Input Clamping Structure For Sound Quality Improvement In Car-Radio Class-Ab Power Amplifier Design, which is hereby incorporated by reference to the maximum extent allowable by law.

FIELD OF THE INVENTION

The present invention relates to class AB power amplifiers, and more particularly, to an input clamping circuit for improving sound quality of the amplifier.

BACKGROUND OF THE INVENTION

A typical input clamping structure 100 for a class AB power amplifier is shown in FIG. 1. Circuit 100 includes a reference voltage generator including a first leg comprising a first bias current I1 (typically between 70 and 100 microamps) coupled to node 104, serially coupled diodes D1, D2, D3, and D4, and resistor R1 (typically about 3K ohms). A second leg of the reference voltage generator comprises a second bias current I2 (typically between 70 and 100 microamps), a transistor Q1 having a drain for receiving the I2 bias current at node 102, a base coupled to node 104, and an emitter coupled to resistor R2 (typically about 30K ohms). The voltage at node 104 is about 3.3 volts. The two bias currents are also coupled to VDD, which is typically set at about 14.4 volts for a power amplifier. The clamping circuit also includes four NPN Darlington transistors Q2/Q3, Q4/Q5, Q6/Q7 for generating clamped input voltages PLAY1, PLAY2, PLAY4. The PLAY1 node is coupled through resistors R3 and R4 to the SVR node. The values of resistors R3 through R10 is about 25K ohms. The SVR node stands for "Supply Voltage Rejection" and is an internal reference node set to about VDD/4. The serially coupled resistors are shown for better matching and routing in layout design of an integrated circuit. Similarly, the PLAY2 node is coupled through resistors R5 and R6 to the SVR node, and the PLAY4 node is coupled through resistors R7 and R8 to the SVR node. The ACGND node is coupled through resistors R9 and R10 to the SVR node. Note that the value of resistors R9 and R10 is one fourth the value of the PLAY node resistors. ACGND is the common node corresponding to nodes PLAY1 to PLAY 4, as will be seen and described in further detail below, and so these resistors must be four resistors in a parallel connection.

In FIG. 2 PLAYx and CMP_ACGNDx are the direct inputs to the amplifier input stage. In the layout of the integrated circuit the star-point (the metal traces to the destination must be coming from the same point although each of the metal traces are at the same potential) is from ACGND in FIG. 2, and $R_{short}$ is the routing metal resistance. Resistor R1 is about 600 ohms and R1/4 is about 600 ohms, divided by four. Note that the resistors shown in FIG. 2 are different than those shown in FIG. 1. In FIG. 2, there are four ACGND nodes that correspond to four input nodes. The four ACGND nodes (CMP_ACGND1, CMP_ACGND2, CMP_ACGND3, and CMP_ACGND4) are coupled to the same point (ACGND) and the four inputs (PLAY1, PLAY2, PLAY3, and PLAY4) are independent. The capacitors shown in FIG. 2 represent discrete capacitors that are used in conjunction with the class AB amplifier integrated circuit.

The integrated circuit class AB amplifier 300 is shown in FIG. 3, including amplifier pair 302, amplifier pair 304, amplifier pair 306, amplifier pair 308, and clamp circuitry 310. The input and ground connections are all as previously described. In FIG. 3, the Rf resistors are typically 8K ohms, and the Re resistors are typically 400 ohms. The class AB amplifier 300 is shown in a typical audio application for driving loudspeakers.

While the amplifier 300 shown in FIG. 3 achieves a good level of performance, it is limited by the unbalanced ground connection. What is desired is a class AB amplifier that has the highest level of audio performance and least amount of distortion with a completely separate and balanced ground connection.

SUMMARY OF THE INVENTION

According to the present invention, a novel input clamping structure for a car-radio class-AB power amplifier has ACGND node that is separated into four discrete branches. Correlative pad connection optimization and layout constraints are adopted to improve sound quality.

According to the present invention, a clamping circuit for an AB amplifier comprises a reference voltage circuit, a plurality of NPN Darlington transistors having a plurality of inputs coupled to the reference voltage circuit, and a plurality of outputs for providing a plurality of clamped voltages, and a split NPN Darlington transistor having an input coupled to the reference voltage circuit, and a plurality of outputs for providing a plurality of AC ground voltages. The reference voltage circuit comprises a first leg comprising a first bias current, a plurality of serially coupled diodes, and a resistor, and a second leg comprising a second bias current, a transistor, and a resistor. The clamping circuit further comprises a plurality of input diodes interposed between the reference voltage circuit and the plurality of Darlington transistors, and a plurality of emitter resistors coupled to the plurality of Darlington transistors. The clamping circuit also further comprises an input diode interposed between the reference voltage circuit and the split Darlington transistor, and an emitter resistor coupled to the split Darlington transistor.

According to the present invention, an AB amplifier circuit includes a plurality of AB amplifiers each having a play input and a ground input and a clamping circuit comprising a plurality of play outputs respectively coupled to each play input and a plurality of separate and balanced ground outputs respectively coupled to each ground input.

According to the present invention, a corresponding clamping method for an AB amplifier according to the present invention includes providing first, second, third, and fourth input clamp signals to the AB amplifier, and providing first, second, third, and fourth corresponding balanced and separate AC ground signals to the AB amplifier.

DETAILED DESCRIPTION

Figure 4:
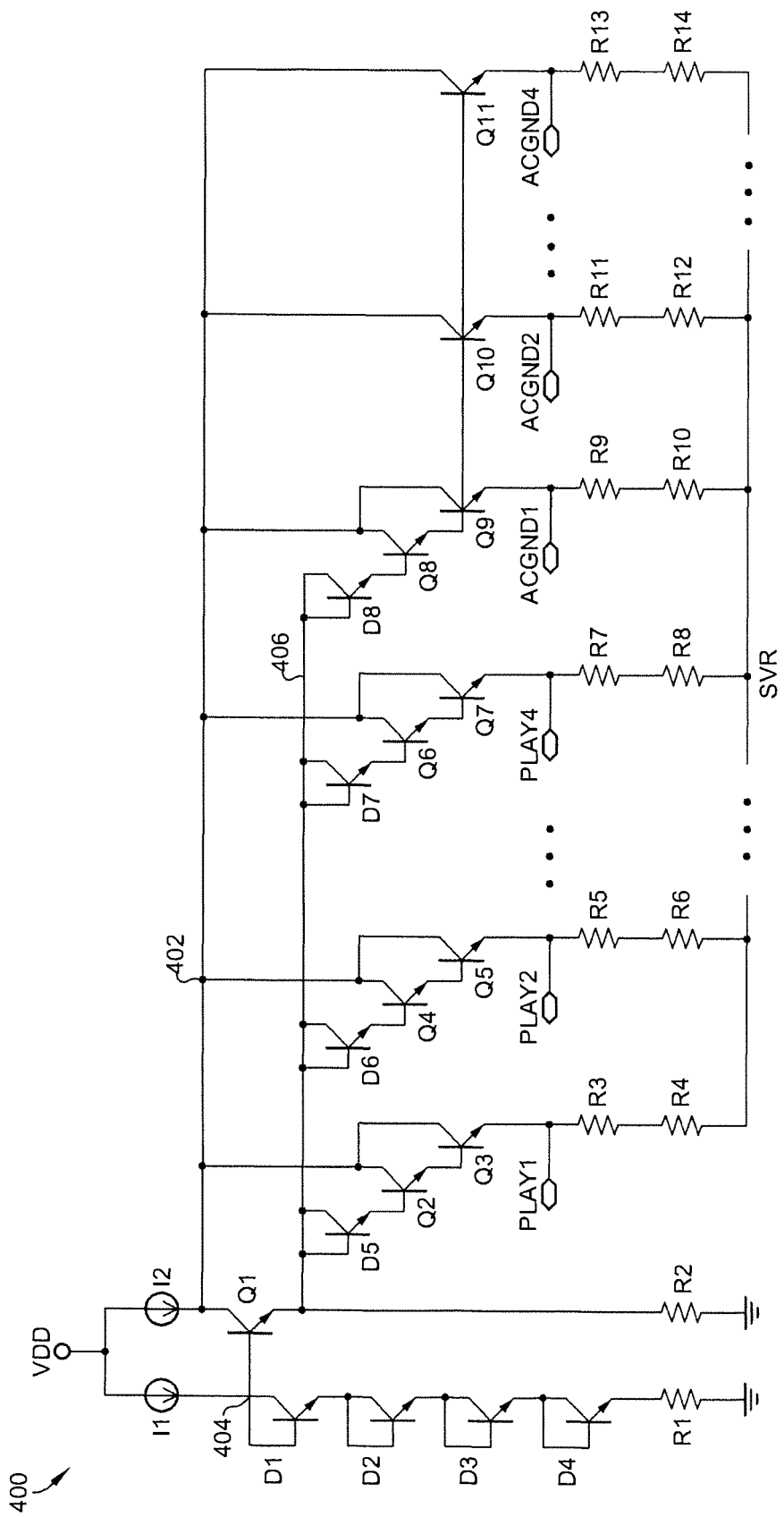
FIG. 4 is a schematic diagram of an input biasing circuit for a class AB power amplifier according to the present invention.
Figure 5:
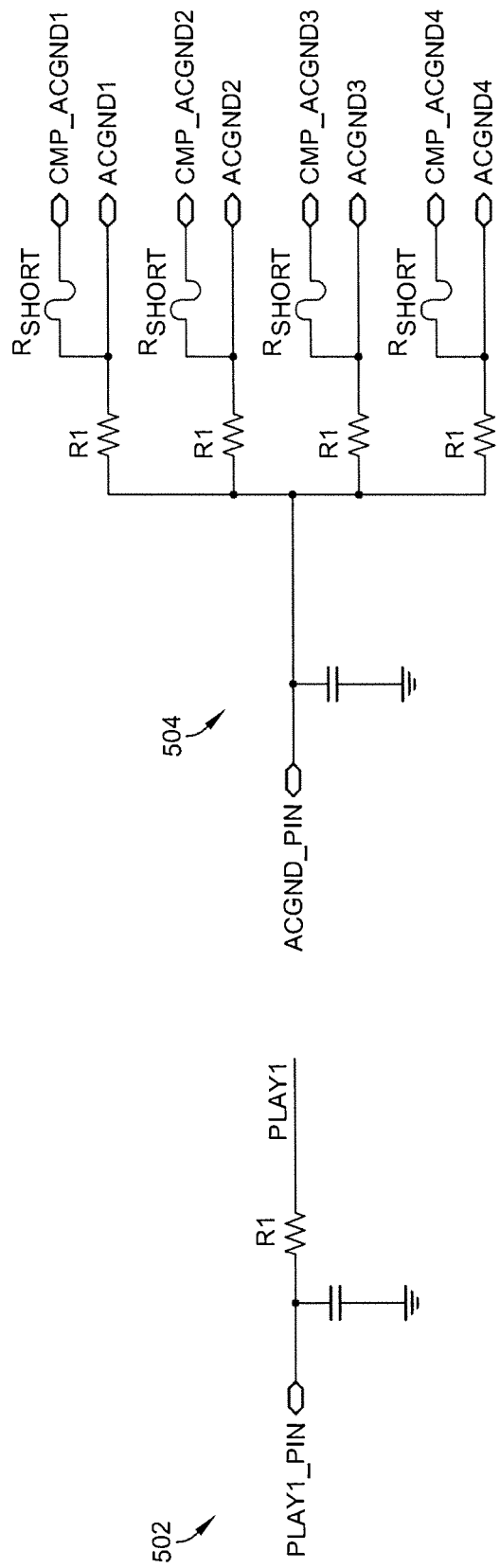
FIG. 5 is a schematic diagram of further details regarding the separated inputs to the four amplifier bridges in the class AB amplifier according to the present invention.
Figure 6:
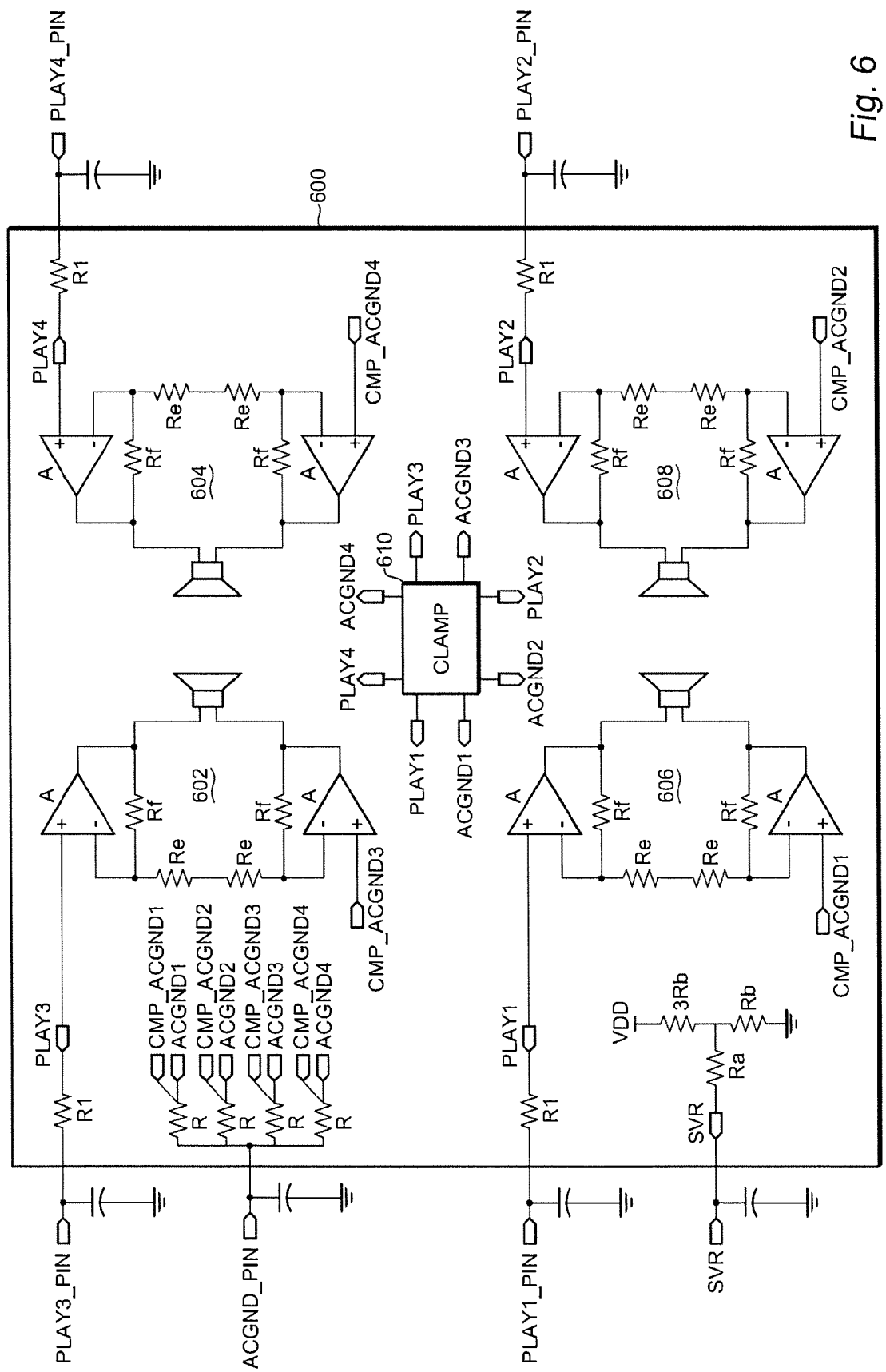
FIG. 6 is a schematic diagram of a class AB amplifier and clamping circuitry according to the present invention.

According to the present invention, a clamp circuit and a class AB circuit incorporating the clamp circuit is shown in FIGS. 4-6. The ACGND node is separated into four separate and balanced branches. Since current injected to ACGNDx is the same as PLAYx, the resistor between SVR and ACGNDx is also changed to the same as that between SVR and PLAYx, so PLAYx and ACGNDx are completely balanced and matching is much better in the corresponding layout.

Referring now to FIG. 4, a clamping circuit 400 includes a reference voltage circuit as before, and a plurality of Darlington transistors as before. Previous nodes 102, 104, and 106 are relabeled 402, 404, and 406 in FIG. 4. Note that a split NPN Darlington transistor Q8, Q9, Q10, . . . , Q11 is shown having an input coupled to the reference voltage circuit at node 406, and a plurality of outputs for providing a plurality of AC ground voltages ACGND1, ACGND2, . . . , and ACGND4. An input diode D8 is interposed between the reference voltage circuit and the split Darlington transistor. Clamping circuit 400 comprises a plurality of emitter resistors R9/R10, R11/R12, . . . , R13/R14 coupled to the split Darlington transistor. The value of each of the resistors shown in FIG. 4 is 25K ohms.

FIG. 5 shows circuitry 502 and 504 that provides corresponding connections to circuit pads. Circuit 502 shows the signal input connections, and circuit 504 shows the balanced and separate ground connections. The PLAYx_PIN, ACGND_PIN and SVR nodes are external pad connections, and the rest of the circuit nodes are internal. The circuit elements of FIG. 5 are shown in the context of the AB amplifier circuit in FIG. 6. The star-point is from the pad of ACGND in layout. The star-point from SVR to the resistors inside inputs the biasing circuit starts also directly from SVR pad. The CMP_ACGNDx nodes go to the ground input of the AB amplifiers, and the ACGNDx nodes are coupled to the clamp circuit. The capacitors shown in FIG. 5 are discrete capacitors, external to the integrated circuit including the class AB amplifiers and the clamp circuit. A resistor R1 is associated with each signal input PLAYx_PIN to PLAYx node, and each ground connection ACGND_PIN to ACGNDx node.

Figure 1:
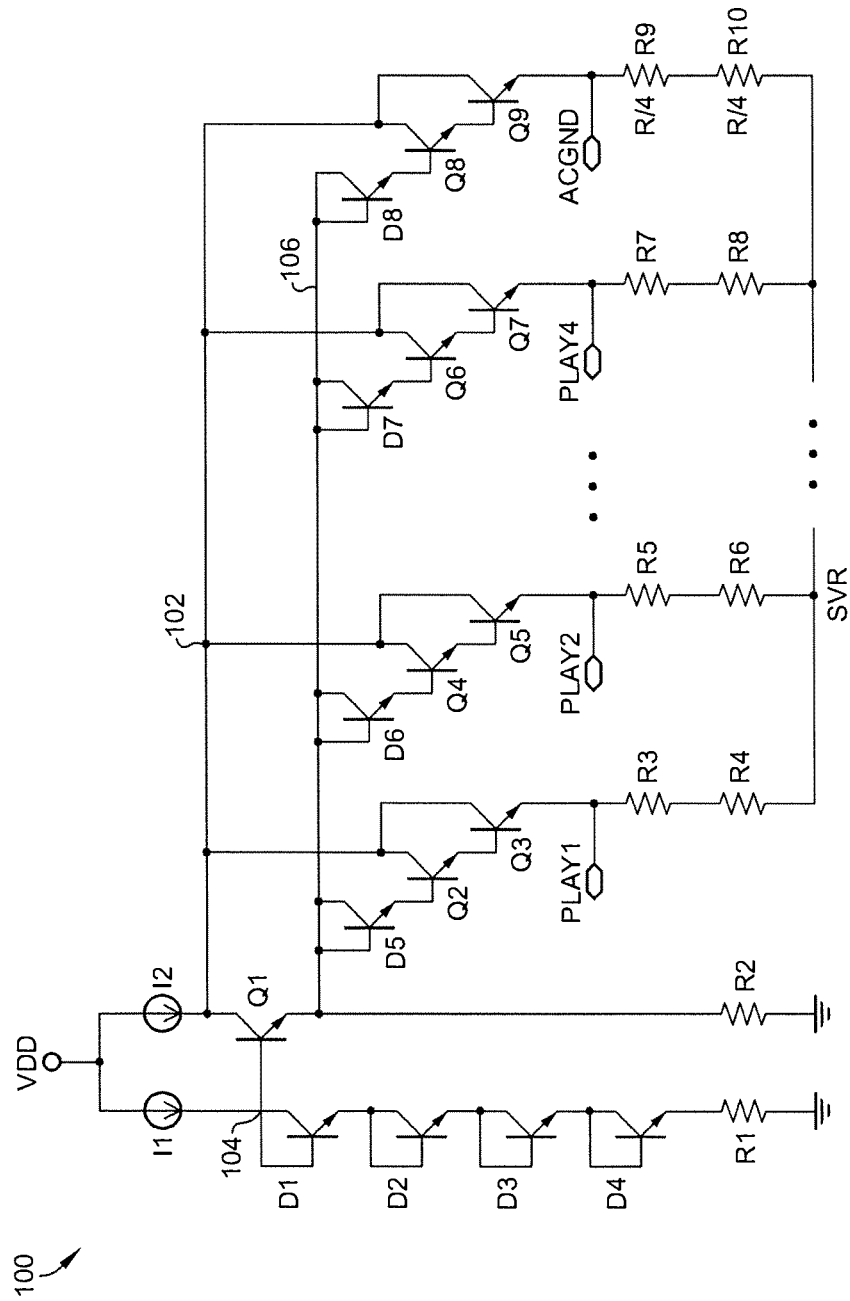
FIG. 1 is a schematic diagram of a typical input biasing circuit for a class AB power amplifier according to the prior art.
Figure 2:
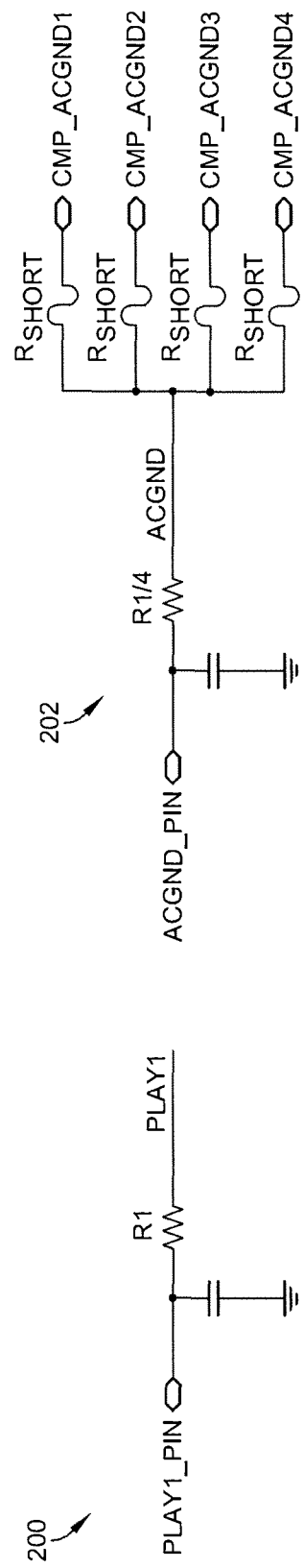
FIG. 2 is a schematic diagram of further details regarding the inputs to the class AB power amplifier.
Figure 3:
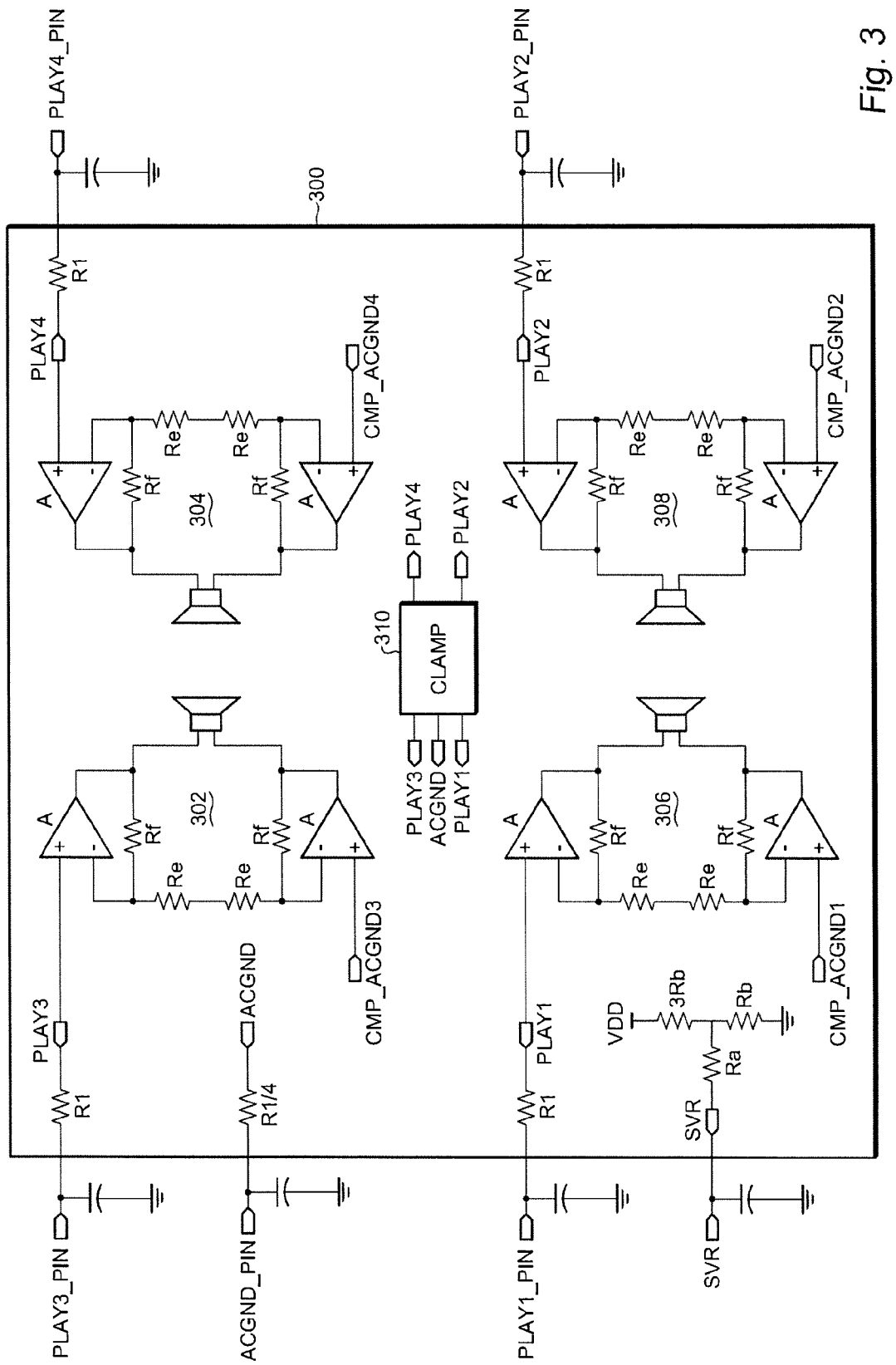
FIG. 3 is a schematic diagram of a class AB amplifier and clamping circuitry according to the prior art.

Referring now to FIG. 6, a class AB amplifier circuit including a clamp circuit 600 is shown. Circuit 600 includes class AB amplifiers 602, 604, 606, and 608, as well as clamp circuit 610. Each class AB amplifier includes four internal resistors as shown. The values of the Rf and Re resistors are the same as identified with the prior art amplifier shown in FIG. 3. Each PLAYx_PIN includes an external capacitor, a series resistor R1, and a PLAYx node coupled to a positive input of a first operational amplifier of the corresponding class AB amplifier. The ACGND_PIN includes an external capacitor, four series resistors R, which in turn is coupled to the CMP_ACGNDx and ACGNDx nodes. The CMP_ACGNDx nodes are coupled to a positive input of a second operational amplifier of the corresponding class AB amplifier. The ACGNDx nodes are provided by the clamp circuit 610. The SVR pin includes an external capacitor and is coupled to the internal SVR node. The SVR node is coupled to resistor Ra, which is in turn coupled to the center tap of resistors Rb and 3Rb. Resistors Rb and 3Rb are coupled between VDD and ground.

In the present invention, a clamp circuit having separated and well balanced ground connections is used to improve sound quality. Layout optimization is also of great importance. The layout design should obey the rule strictly to match and balance every inputs of the amplifier and the general layout guidelines should always be implemented.

Figure 7:
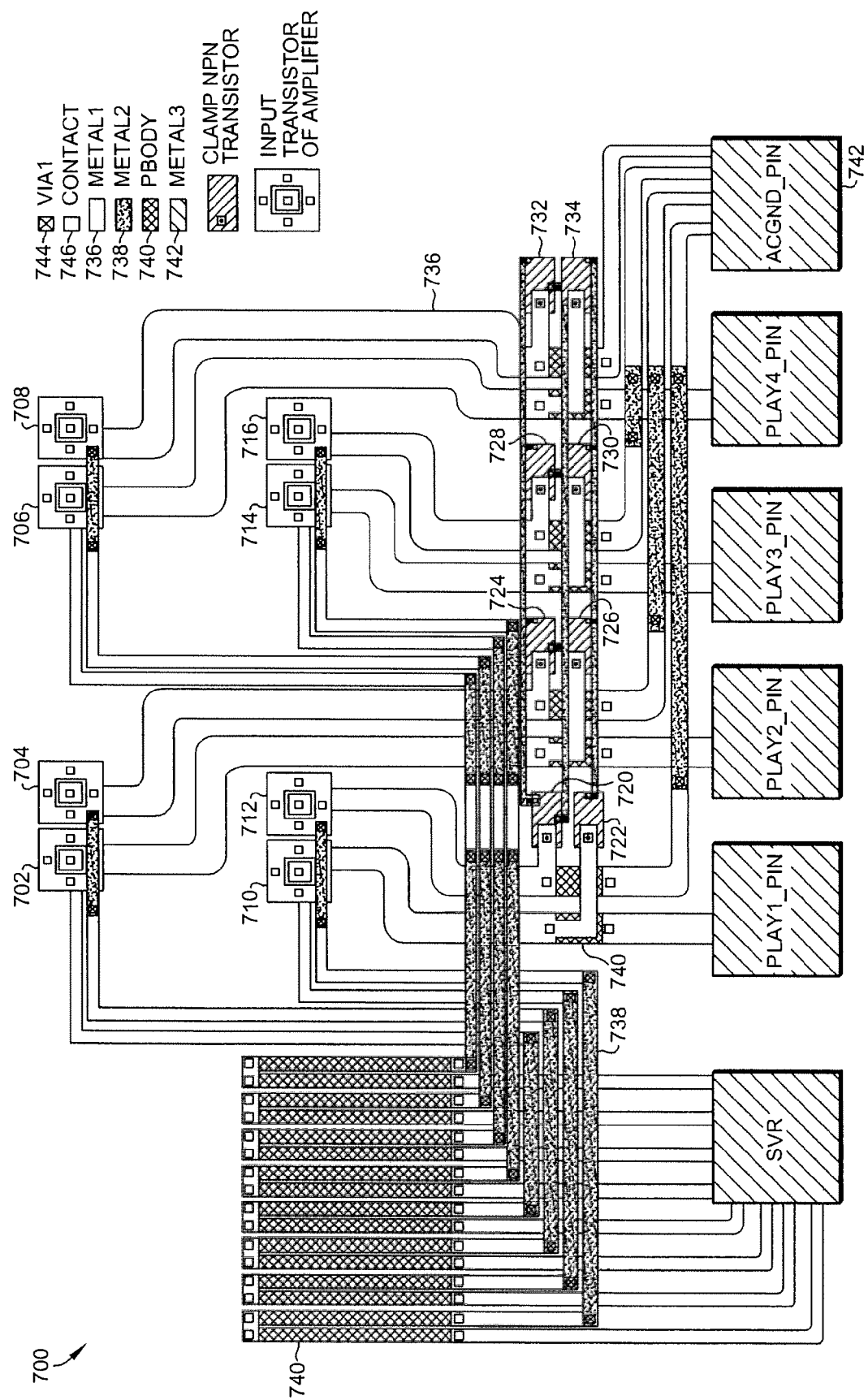
FIG. 7 is a plan view of a layout of the class AB amplifier and clamping circuitry according to the present invention.

Referring now to FIG. 7, a layout 700 for the integrated circuit according to the present invention is shown. The SVR, PLAY1_PIN, PLAY2_PIN, PLAY3_PIN, PLAY4_PIN, and ACGND_PIN pins are shown. Input transistors 702 and 704 correspond to the input differential pair receiving the PLAY2 and CMP_ACGND2 voltages, input transistors 706 and 708 correspond to the input differential pair receiving the PLAY4 and CMP_ACGND4 voltages, input transistors 710 and 712 correspond to the input differential pair receiving the PLAY1 and CMP_ACGND1 voltages, and input transistors 714 and 716 correspond to the input differential pair receiving the PLAY3 and CMP_ACGND3 voltages. Layout 700 also includes clamping transistors 720 and 722 that correspond to transistor Q3 and Q7, clamping transistors 724 and 726 that correspond to transistors Q5 and Q9, clamping transistors 728 and 730 that correspond to transistors Q7 and Q10, and clamping transistors 732 and 734 that correspond to the transistors used to clamp the PLAY3 and ACGND3 voltages (not shown). Also shown in FIG. 7 are vias 744 that couple a first metal level 736 to a second metal level 738, and contacts 746 that couple resistors to the first metal level 736. Pbody resistors shown in FIG. 7 correspond to resistors R3 through R12 (left side of the figure) and resistor R1 (center of figure). All of the pins in FIG. 7 are provided by a third level of metal 742.

It is important to note that all of the signal inputs and the ground connections shown in the layout of FIG. 7 are separate and balanced. Other variations of the layout 700 shown in FIG. 7 are of course possible while providing the balanced signal and ground connections according to the present invention. Due to the balanced layout and design of the present invention, the class AB amplifier circuit will provide a much improved sound quality.

In summary a clamping method for an AB amplifier includes providing first, second, third, and fourth input clamp signals to the AB amplifier, and providing first, second, third, and fourth corresponding separate and balanced AC ground signals to the AB amplifier.

It will be apparent to those skilled in the art, therefore, that various modifications and variations can be made to the invention without departing from the spirit or scope of the invention. Thus, it is intended that the present invention covers the modifications and variations of this invention provided they come within the scope of the appended claims.

We claim:
1. A clamping circuit comprising:
a reference voltage circuit;
a plurality of Darlington transistors having a plurality of inputs coupled to the reference voltage circuit, and a plurality of outputs for providing a plurality of clamped voltages; and
a split Darlington transistor comprising
a first transistor and a second transistor coupled together in a Darlington configuration,
at least one third transistor coupled to the second transistor, the first transistor, second transistor and at least one third transistor having inputs coupled to the reference voltage circuit, and the second transistor and at least one third transistor having a plurality of outputs for providing a plurality of AC ground voltages.

2. The clamping circuit of claim 1 wherein the reference voltage circuit comprises a first leg comprising a first bias current source, a plurality of serially coupled diodes coupled to the first bias current source, and a resistor coupled in series with the serially coupled diodes.

3. The clamping circuit of claim 2 wherein the reference voltage circuit comprises a second leg comprising a second bias current source, a transistor coupled to the second bias current source, and a resistor coupled in series with the transistor.

4. The clamping circuit of claim 1 wherein the plurality of Darlington transistors comprises a plurality of NPN Darlington transistors.

5. The clamping circuit of claim 1 further comprising a plurality of input diodes coupled between the reference voltage circuit and respective ones of the plurality of Darlington transistors.

6. The clamping circuit of claim 1 further comprising a plurality of emitter resistors coupled to respective ones of the plurality of Darlington transistors.

7. The clamping circuit of claim 1 wherein the split Darlington transistor comprises an NPN split Darlington transistor.

8. The clamping circuit of claim 1 further comprising an input diode coupled between the reference voltage circuit and the split Darlington transistor.

9. The clamping circuit of claim 1 further comprising a plurality of emitter resistors coupled to the split Darlington transistor.

10. The clamping circuit of claim 1 wherein the at least one third transistor comprises a plurality of third transistors.

11. A circuit comprising:
a reference voltage circuit;
a plurality of Darlington transistors having a plurality of inputs coupled to the reference voltage circuit, and a plurality of outputs for providing a plurality of clamped voltages; and
a split Darlington transistor comprising
a first transistor and a second transistor coupled together in a Darlington configuration,
at least one third transistor coupled to the second transistor,
the first transistor, second transistor and at least one third transistor having inputs coupled to the reference voltage circuit, and
the second transistor and at least one third transistor having a plurality of outputs configured to provide a plurality of AC reference voltages.

12. The circuit of claim 11 wherein the reference voltage circuit comprises a first leg comprising a first bias current source, a plurality of serially coupled diodes coupled to the first bias current source, and a resistor coupled in series with the serially coupled diodes.

13. The circuit of claim 12 wherein the reference voltage circuit comprises a second leg comprising a second bias current source, a transistor coupled to the second bias current source, and a resistor coupled in series with the transistor.

14. The circuit of claim 11 wherein the plurality of Darlington transistors comprises a plurality of NPN Darlington transistors.

15. The circuit of claim 11 further comprising a plurality of input diodes coupled between the reference voltage circuit and respective ones of the plurality of Darlington transistors.

16. The circuit of claim 11 further comprising a plurality of emitter resistors coupled to respective ones of the plurality of Darlington transistors.

17. The circuit of claim 11 wherein the split Darlington transistor comprises an NPN split Darlington transistor.

18. The circuit of claim 11 further comprising an input diode coupled between the reference voltage circuit and the split Darlington transistor.

19. The circuit of claim 11 further comprising a plurality of emitter resistors coupled to the split Darlington transistor.

20. The circuit of claim 11 wherein the at least one third transistor comprises a plurality of third transistors.

* * * * *